(12) United States Patent
Uno

(10) Patent No.: US 7,939,936 B2
(45) Date of Patent: May 10, 2011

(54) SEMICONDUCTOR PACKAGE HAVING SEMICONDUCTOR DEVICE FEATURING EXTERNALLY-ACCESSIBLE ENDLESS RING-SHAPED RESISTANCE CIRCUIT

(75) Inventor: Satoshi Uno, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 713 days.

(21) Appl. No.: 11/798,096

(22) Filed: May 10, 2007

(65) Prior Publication Data
US 2008/0128893 A1 Jun. 5, 2008

(30) Foreign Application Priority Data
May 11, 2006 (JP) .................................. 2006-132235

(51) Int. Cl.
*H01L 23/485* (2006.01)
*H01L 23/58* (2006.01)
(52) U.S. Cl. ........ 257/700; 257/672; 257/691; 257/773; 257/E23.021
(58) Field of Classification Search .................. 257/700, 257/672, 691, 773, E23.021
See application file for complete search history.

(56) References Cited

U.S. PATENT DOCUMENTS

| 6,201,308 B1* | 3/2001 | Ikegami et al. ............... 257/786 |
| 6,998,712 B2* | 2/2006 | Okada et al. .................. 257/758 |
| 2002/0140107 A1* | 10/2002 | Kato et al. .................... 257/777 |
| 2004/0188843 A1* | 9/2004 | Wakayama et al. ........... 257/758 |
| 2005/0194649 A1* | 9/2005 | Oki ................................ 257/409 |
| 2005/0212071 A1* | 9/2005 | Yue et al. ...................... 257/452 |

FOREIGN PATENT DOCUMENTS

| JP | 2002-33918 | 3/2002 |
| JP | 2002-141474 | 5/2002 |

* cited by examiner

*Primary Examiner* — Lynne A. Gurley
*Assistant Examiner* — Junghwa M Im
(74) *Attorney, Agent, or Firm* — Young & Thompson

(57) ABSTRACT

A semiconductor package includes a wiring board having a plurality of first electrode pads exposed on a top surface thereof, and a plurality of second electrode pads exposed on a bottom surface thereof, and the first electrode pads are electrically connected to the respective second electrode pads. A semiconductor device is mounted on the top surface of the wiring board, and includes an endless ring-shaped resistance circuit formed in an interior of the device along a periphery thereof, and a plurality of third electrode pads provided inside the resistance circuit and electrically connected to the resistance circuit. The third electrode pads are electrically connected to the first electrode pads, respectively. A sealing resin layer is formed over the first surface of the wiring board so that the device and the first electrode pads are sealed and protected by the sealing resin layer.

14 Claims, 8 Drawing Sheets

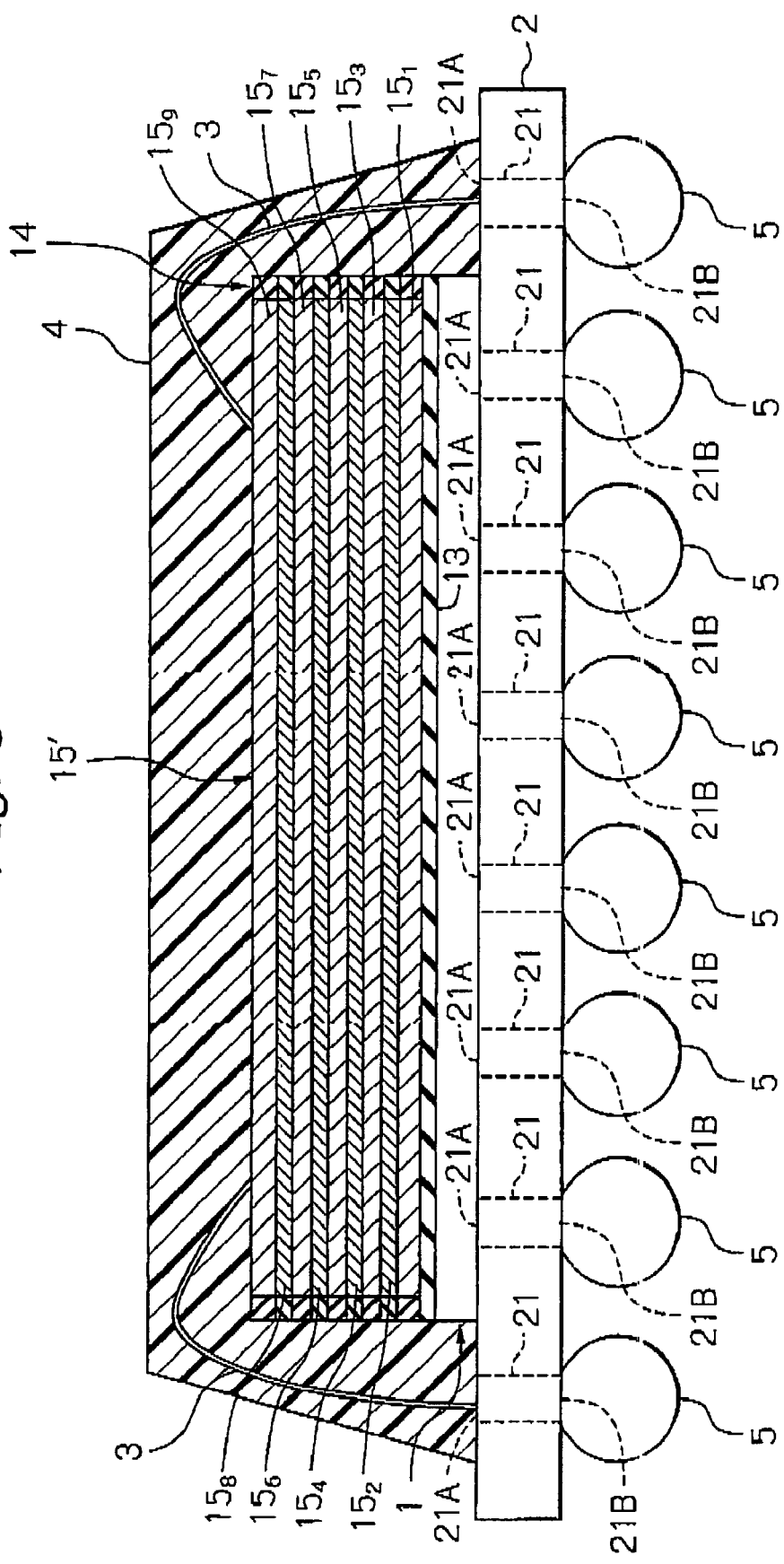

SEMICONDUCTOR PACKAGE HAVING SEMICONDUCTOR DEVICE FEATURING EXTERNALLY-ACCESSIBLE ENDLESS RING-SHAPED RESISTANCE CIRCUIT

BACKGROUND OF THE INVENTION

1. Field of the Invention

The present invention relates to a semiconductor package such as a ball grid array (BGA) type semiconductor package which includes a wiring board, a semiconductor device mounted on a top surface of the wiring board, a seating resin layer formed on the top surface of the wiring board so as to seal and protect the semiconductor device, and a plurality of external electrode terminals such as solder balls provided on a bottom surface of the wiring board.

2. Description of the Related Art

Conventionally, a semiconductor device used in a BGA type semiconductor package includes a rectangular-silicon substrate derived from a monocrystalline silicon wafer, an insulating underlayer or contact layer formed on a top surface of the silicon substrate, and a multi-layered-insulating structure formed on the contact layer.

The multi-layered insulating structure includes a plurality of insulating interlayers stacked in order, and both a plurality of conductive pattern layers and a plurality of via-structures are alternately formed in the insulating interlayers so that the conductive pattern layers are electrically connected to each other through the via-structures.

Conventionally, each of the insulating interlayers is formed as a silicon dioxide layer, and the conductive pattern layers and the via-structures are composed of aluminum.

With the recent advance of miniaturization and integration of semiconductor devices such as 130 nm node semiconductor devices, multi-layered insulating structures become smaller, and thus the conductive pattern layers for signal transmission become thinner, resulting in delay of signal propagation in the conductive patterns, due to parasitic resistance of the transmission conductive pattern layers and parasitic capacitance involved in the conductive pattern layers.

In short, the miniaturization of semiconductor devices has advanced to a degree in which a magnitude of a dielectric constant of the silicon dioxide layer and a magnitude of a resistance of the aluminum conductive pattern layers cannot be neglected.

Thus, there is a recent trend toward use of copper, exhibiting a smaller specific resistance than that of aluminum, for the conductive patterns, whereby it is possible to facilitate the signal transmission in the conductive pattern layers. Also, it has been proposed that an insulating interlayer, composed of a low-k material having a smaller dielectric constant than that of silicon dioxide, be substituted for the silicon dioxide layer, to thereby suppress the production of the parasitic capacitance. Note, for the low-k material, SiOC, SiC, SiOF, porous $SiO_2$, porous SiOC or the like may be used.

Nevertheless, the low-k insulating interlayer has an inferior physical strength to that of the silicon dioxide layer. Thus, the low-k insulating interlayer is susceptible to defects such as cracks during various processes for manufacturing the semiconductor device.

Also, the conductive pattern layers are liable to be peeled from the low-k insulating interlayers due to the fact that the difference in a thermal expansion coefficient between the low-k insulating interlayers and the conductive pattern layers is relatively large.

Further, the low-k insulating interlayers tend to absorb moisture, and the absorbed moisture causes corrosion in the conductive pattern layers in the multi-layered insulating structure.

In JP-2002-141474 A, it has been proposed that an endless rectangular guard-ring resistance circuit is formed in the multi-layered insulating structure along the periphery thereof, and is provided with four probing electrode pads exposed on a top surface of the multi-layered insulating structure and arranged at the corners of the top surface thereof. The guard ring resistance circuit is utilized to determine whether defects and/or peeling occur in the interior of the multi-layered insulating structure.

In particular, a resistance is measured between the probing electrode pad, and the measured resistance value is compared with a normal resistance value. When defects and/or peeling have occurred in the guard-ring resistance circuit, the measured resistance value differs from the normal resistance value. Thus, when the measured resistance value differs from the normal resistance value, it is possible to presume that defects and/or peeling have occurred in the interior of the multi-layered insulating structure. Note that this will be explained later in detail.

Also, in JP-2002-093918 A, it has been proposed that three ring-like open resistance circuits are formed in the multi-layered insulating structure along the periphery thereof, and each of the ring-like open resistance circuits terminates with a pair of electrode terminals adjacent to each other. The ring-like open resistance circuits are utilized to determine whether defects and/or peeling occur in the interior of the multi-layered insulating structure.

In particular, in each of the ring-like open resistance circuits, a resistance is measured between the two adjacent electrode terminals, and the measured resistance value is compared with a normal resistance value. When defects and/or peeling have occurred in the corresponding ring-like open resistance circuit, the measured resistance value differs from the normal resistance value. Thus, when the measured resistance value differs from the normal resistance value, it is possible to presume that defects and/or peeling have occurred in the interior of the multi-layered insulating structure.

In JP-2002-093918 A, when a crack occurs as a defect in a space between the two adjacent electrode terminals of each of the ring-like open resistance circuits, the crack cannot be detected by the measurement of the resistance value between the adjacent electrode terminals. This problem can be solved by forming more than three ring-like open resistance circuits in the multi-layered insulating structure such that the pairs of electrode terminals are shifted from each other along the periphery thereof, but an area for forming the more than three ring-like open resistance circuits is increased so that an area for forming the conductive pattern layers is restricted in the multi-layered insulating structure. Note that this will be explained later in detail.

SUMMARY OF THE INVENTION

It has now been discovered that the above-mentioned prior art semiconductor devices have a problem to be solved as will be mentioned in detail hereinafter.

Each of the aforesaid prior art semiconductor devices (JP-2002-141474 A and JP-2002-093918 A) is used, in a BGA type semiconductor package. Namely, the semiconductor device is mounted on a top surface of a wiring board called an interposer or a package board, and electrode pads forming a part of the uppermost conductive pattern layer on the multi-layered insulating structure are electrically connected to electrode pads formed on the top surface of the wiring board by a plurality of bonding wires, using a wire bonding machine. Then, a sealing resin layer is formed over the top surface of the wiring board so that the semiconductor device, the bonding wire and so on are sealed and protected by the sealing resin layer.

When the wire bonding process is carried out by the wire bonding machine, the low-k insulating interlayers of the multi-layered insulating structure are susceptible to a defect due to an impact which is produced when a bonding wire is bonded to each of the electrode pads on the semiconductor device.

On the other hand, when the moisture is absorbed by the low-k insulating interlayers of the multi-layered insulating structure, it takes a relatively long time until the absorbed moisture causes the corrosion in the conductive pattern layers formed in the interior of the multi-layered insulating structure. Thus, a defect based on the corrosion may occur later in the conductive pattern layers.

Nevertheless, it is impossible to utilize the endless guard ring resistance circuit (JP-2002-141474 A) or the ring-like open resistance circuits (JP-2002-093918 A) to determine whether the defect and/or the peeling occurred in the multi-layered insulating structure, because the semiconductor device can be no longer accessed due to the fact that the semiconductor device is sealed by the sealing resin layer.

In accordance with an aspect of the present invention, there is provided a semiconductor package including a wiring board, a semiconductor device and a sealing resin layer. The wiring board has a first surface and a second surface and is provided with a plurality of first electrode pads exposed on the first surface thereof, and a plurality of second electrode pads exposed on the second surface thereof, with the first electrode pads being electrically connected to the second electrode pads, respectively. The semiconductor device is mounted on the first surface of the wiring board, and includes an endless ring-shaped resistance circuit formed in an interior of the semiconductor device along a periphery thereof, and a plurality of third electrode pads provided inside the endless ring-shaped resistance circuit and electrically connected to the endless ring-shaped resistance circuit, with the third electrode pads being electrically connected to the first electrode pads, respectively. The sealing resin layer is formed over the first surface of the wiring board so that the semiconductor device and the first electrode pads are sealed and protected by the sealing resin layer.

Preferably, the semiconductor device further includes a plurality of take-out conductive layers to establish the electrical connection between the third electrode pads and the endless ring-shaped resistance circuit. Each of the take-out conductive layers may include at least a portion extending in parallel with a side of the endless ring-shaped resistance circuit. Also, each of the take-out conductive layers may include a first portion perpendicularly and inwardly extending from a side of the endless ring-shaped resistance circuit, a second portion extending from the first portion in parallel with the side of the endless ring-shaped resistance circuit, and a third portion perpendicularly and inwardly extending from the second portion to a corresponding one of the third electrode pads.

When the number of the third electrode pads is four, the four third electrode pads may be electrically connected to the endless ring-like resistance circuit at four locations at which the endless ring-shaped resistance circuit is sectioned into four sections having substantially the same length.

At least a part of the endless ring-like resistance circuit may be formed as a stacked conductive column. Preferably, the stacked conductive column includes via-structures and conductive layers alternately stacked.

The endless ring-shaped resistance circuit may include a plurality of lowermost conductive layers arranged along the periphery of the semiconductor device, a plurality of stacked conductive columns which are formed on ends of the lowermost conductive layers, and a plurality of uppermost conductive layers, each of which is formed on two stacked conductive columns formed on inner ends of two adjacent lowermost conductive layers.

Also, the endless ring-shaped resistance circuit may be defined as an endless seal-ring type resistance circuit including a plurality of endless ring-shaped conductive layers stacked in order.

The semiconductor device may further include a plurality of fourth electrode pads arranged beside the third electrode pads. Preferably, the fourth electrode pads have a smaller size than that of the third electrode pads.

The semiconductor device may further include a multi-layered insulating structure, and the endless ring-shaped resistance circuit is formed in the multi-layered insulating structure along a periphery thereof, with the third electrode pads being formed on a top surface of the multi-layered insulating structure.

The multi-layered insulating structure may include a plurality of insulating interlayers stacked in order, and at least a part of the endless ring-shaped resistance circuit is formed in each of the insulating interlayers. Each of the insulating interlayers may be composed of a low-k material, and the endless ring-shaped resistance circuit may be composed of copper (Cu).

BRIEF DESCRIPTION OF THE DRAWINGS

The present invention will be more clearly understood from the description set forth below, as compared with the prior art semiconductor devices, with reference to the accompanying drawings, wherein:

FIG. 8 is a cross-sectional view of a second embodiment of the BOA type semiconductor package according to the present invention.

DESCRIPTION OF THE PREFERRED EMBODIMENTS

Before description of embodiments of the present invention, for better understanding of the present invention, with reference to FIGS. 1 and 2, prior art semiconductor devices will be described below.

Figure 1:
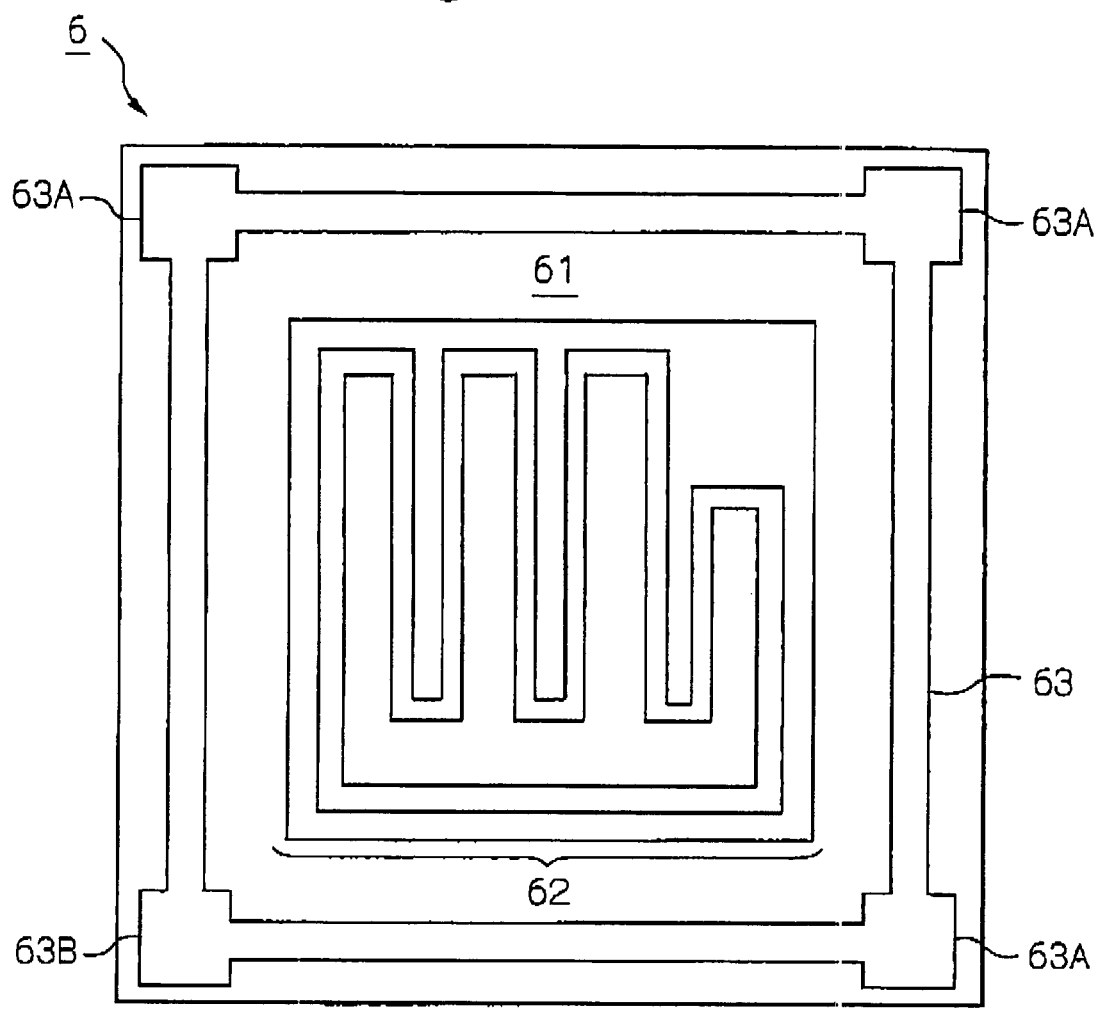
FIG. 1 is a plan view of a first prior art semiconductor device used to manufacture a semiconductor package.

First, with reference to FIG. 1 which is a plan view of a first prior art semiconductor device as disclosed in JP-2002-141474A, the semiconductor device is generally indicated by reference numeral 6, and includes a rectangular semiconductor substrate such as silicon substrate (not visible), an insulating underlayer or contact layer (not visible) formed on the silicon substrate, and a multi-layered insulating structure 61 formed on the contact layer.

The multi-layered insulating structure 61 includes a plurality of insulating interlayers stacked in order, and both a plurality of conductive pattern layers and a plurality of via-structures are alternately formed in the insulating interlayers. Note, in FIG. 1, reference numeral 62 indicates uppermost insulating interlayer of the multi-layered insulating structure 61.

The semiconductor device 6 also includes an endless rectangular guard-ring resistance circuit 63 formed in the multi-layered insulating structure 61 along the sides of the silicon substrate. The guard-ring resistance circuit 63 is provided with four probing electrode pads 63A formed on the top surface of the uppermost insulating interlayer of the multi-layered insulating structure 61 at the respective corners thereof, and is utilized to determine whether a defect and/or peeling occurs in the interior of the multi-layered insulating structure 61.

In particular, a resistance is measured between the probing electrode pads 63A, and the measured resistance value is compared with a normal resistance value. When a defect and/or peeling occurs in the guard-ring resistance circuit 63, the measured resistance value differs from the normal resistance value. Thus, when the measured resistance value differs from the normal resistance value, it is possible to presume that a defect and/or peeling has occurred in the interior of the multi-layered insulating structure.

Figure 2:
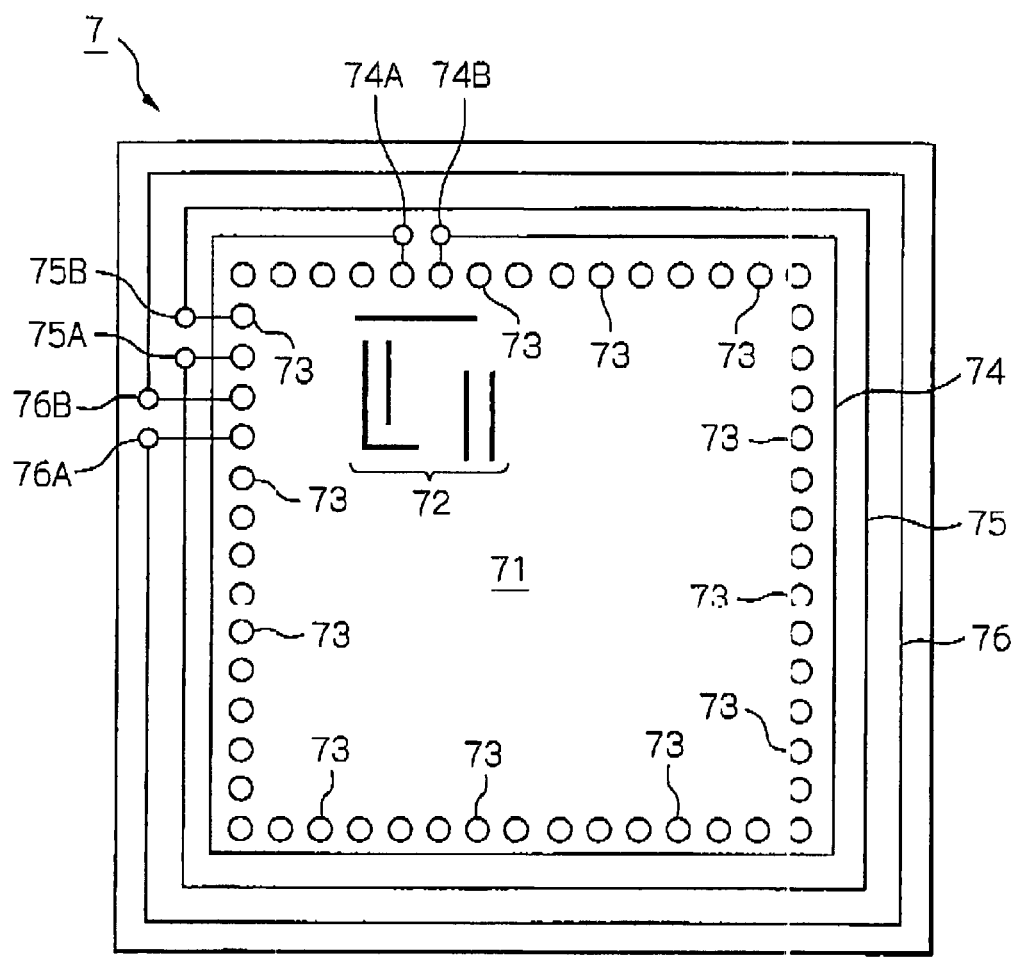
FIG. 2 is a plan view of a second prior art semiconductor device used to manufacture a semiconductor package.

Next, with reference to FIG. 2 which is a plan-view of a second prior art semiconductor device as disclosed in JP 2002 093918 A, the semiconductor device is generally indicated by reference numeral 7, and includes a rectangular semiconductor substrate such as a silicon substrate (not visible), an insulating underlayer or contact layer (not visible), and a multi-layered insulating structure 71 formed on the contact layer.

The multi-layered insulating structure 71 includes a plurality of insulating interlayers stacked in order, and both a plurality of conductive pattern layers and a plurality of via-structures are alternately formed in the insulating interlayers. Note, in FIG. 2, reference numeral 72 indicates a part of a conductive pattern layer formed on the top surface of the uppermost insulating interlayer of the multi-layered insulating structure 71.

A plurality of electrode pads 73 are formed on the top surface of the multi-layered insulating structure 71 so as to be arranged to define a rectangular area in which the conductive pattern layers are formed in the interior of the multi-layered insulating structure 71.

The semiconductor device 7 further includes three ring-like open resistance circuits 74, 75 and 76 which are formed in the multi-layered insulating structure along the periphery thereof, and each of the ring-like open resistance circuits 74, 75 and 76 terminates with a pair of electrode terminals 74A and 74B, 75A and 75D or 76A and 76B adjacent to each other. The ring-like open resistance circuits are utilized to determine whether a defect and/or peeling occurs in the interior of the multi-layered insulating structure 71.

In particular, in each of the ring-like open resistance circuits 74, 75 and 76, a resistance is measured between the two adjacent electrode terminals 744 and 74B, 75A and 75B or 76A and 76B, and the measured resistance value is compared with a normal resistance value. When a defect and/or peeling occurs in the corresponding-ring-like open resistance circuit 74, 75 and 76, the measured resistance value differs from the normal resistance value. Thus, when the measured resistance value differs from the normal resistance value, it is possible to presume that a defect and/or peeling has occurred in the interior of the multi-layered insulating structure 71.

In FIG. 2, when a crack occurs as a defect in a space between the two adjacent electrode terminals 74A and 74B, 75A and 75B or 76A and 76B, the crack cannot be detected by the measurement of the resistance value between the adjacent electrode terminals 74A and 74B, 75A and 75B or 76A and 76B. This problem can be solved by forming more than three ring-like open resistance circuits (74, 75 and 76) in the multi-layered insulating structure 71 so that the pairs of electrode terminals (74A and 74B, 75A and 75B or 76A and 76B) are shifted from each other along the periphery thereof, bit an area for forming the more than three ring-like open resistance circuits (74, 75 and 76) is increased so that an area for forming the conductive pattern layers is restricted in the multi-layered insulating structure 71.

In any event, as stated hereinbefore, although each of the aforesaid first and second prior art semiconductor devices 6 and 7 is used in a BGA type semiconductor package, it is impossible to utilize the endless guard ring resistance circuit 63 or the ring-like open resistance circuits 74, 75 and 76 to determine whether a defect and/or a peeling occur in the multi-layered insulating structure 61 or 72, because the semiconductor device 6 or 7 can be no longer accessed due to the fact that the semiconductor device 6 or 7 is sealed by a sealing resin layer in the BGA type semiconductor package.

First Embodiment

Figure 3:
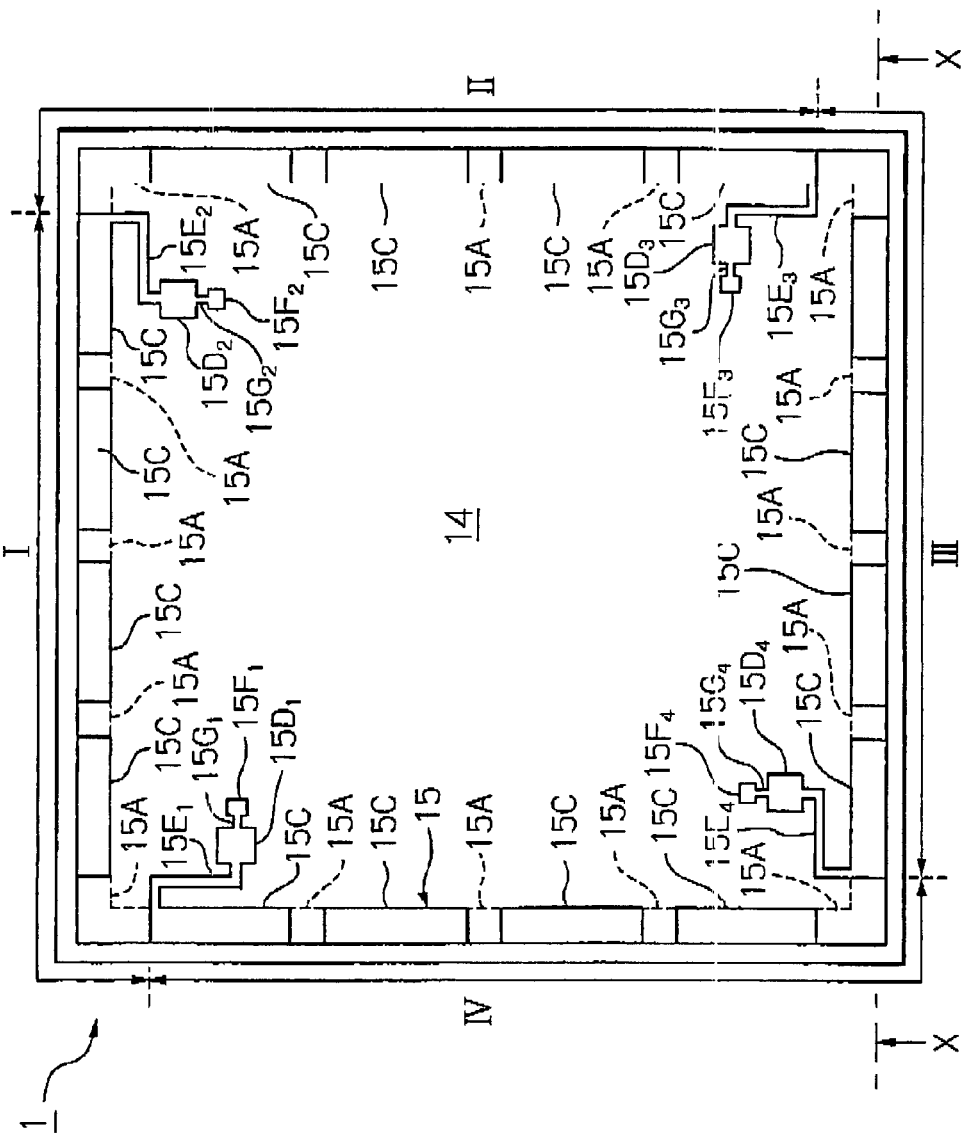
FIG. 3 is a plan view of a semiconductor device used to manufacture a first embodiment of the BGA type semiconductor package according to the present invention.
Figure 4:
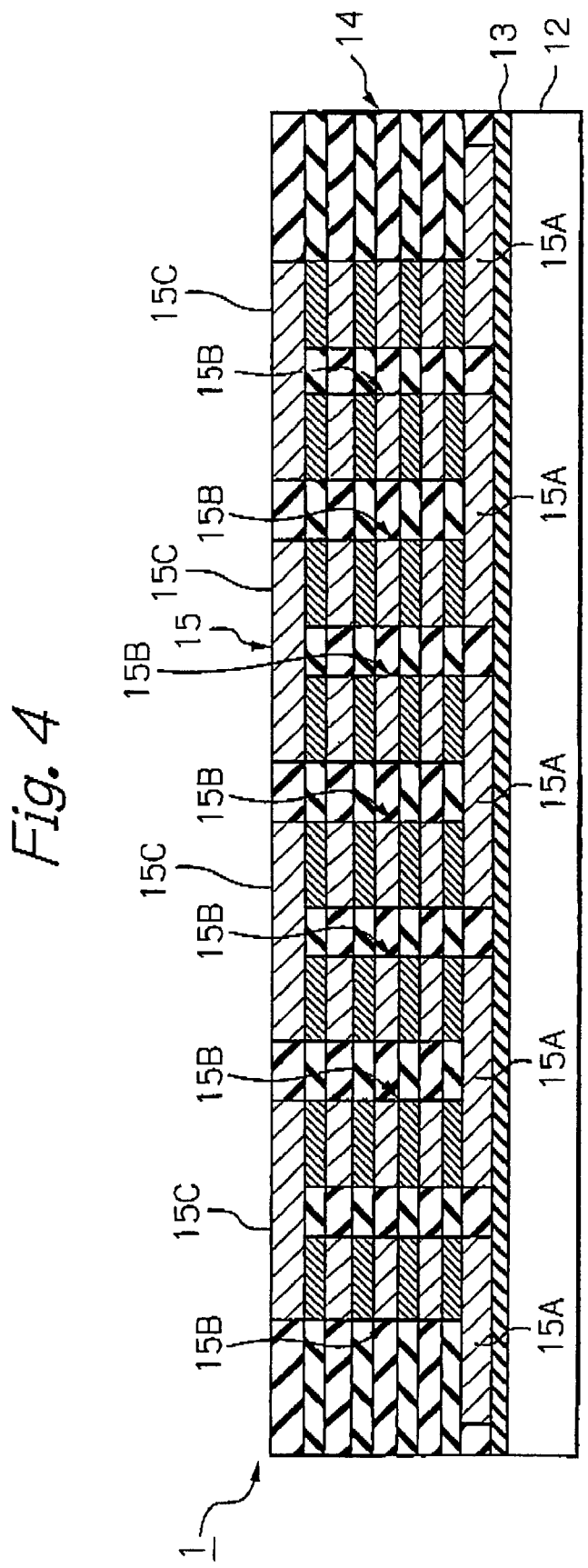
FIG. 4 is a cross-sectional view taken along the X-X line of FIG. 3.

First, referring to FIGS. 3 and 4, a semiconductor device (chip), which is used in a first embodiment of the semiconductor package according to the present invention, is generally indicated by reference 1. Note that FIG. 3 is a plan view of the semiconductor device 1, and that FIG. 4 is a cross-sectional view taken along the X-X line of FIG. 3.

The semiconductor device 1 includes a rectangular semiconductor substrate such as a silicon substrate 12 (see: FIG. 4) derived from a monocrystalline silicon wafer, an insulating underlayer or contact layer 13 (see: FIG. 4) formed on a top surface of the silicon substrate 12, a multi-layered insulating structure 14 (see: FIGS. 3 and 4) formed on the contact layer 13, and an endless ring-shaped resistance circuit 15 (see: FIGS. 3 and 4) formed in the multi-layered insulating structure 14 along the sides of the silicon substrate 12.

Although not shown in FIG. 4, element-isolation layers are formed on the top surface of the silicon substrate 12 so that a plurality of active areas are defined on the top surface thereof, and various electronic elements, such as transistors, resistors, capacitors and so on, are formed on the active areas surrounded by the element-isolation layers. The various electronic elements are covered with the contact layer 13, and a plurality of contact plugs (not shown) are formed in the contact layer 13 so as to be electrically connected to the various electronic elements.

As shown in FIG. 4, the multi-layered insulating structure 14 includes a plurality of insulating interlayers stacked in order, and both a plurality of conductive pattern layers (not shown) and a plurality of via-structures (not shown) are alternately formed in the insulating interlayers.

Also, as shown in FIG. 4, the ring-shaped resistance circuit 15 includes a plurality of lowermost conductive layers 15A formed on the contact layer 13 and arranged along the sides of the silicon substrate 12.

Note, although the four of the lowermost conductive layers 15A, which are positioned at the four corners of the silicon substrate 12, have an L-shaped configuration (see: FIG. 3), the remaining lowermost conductive layers 15A have an elongated configuration.

As shown in FIG. 4, the ring-shaped resistance circuit 15 further includes a plurality of stacked conductive columns 15B which are formed on and electrically connected to the ends of the lowermost conductive layers 15A, and a plurality of uppermost conductive layers 15C, each of which is formed on and electrically connected to the two stacked conductive columns 15B formed on the inner ends of the two adjacent lowermost conductive layers 15A. Thus, the endless ring-shaped resistance circuit 15 has a meandering configuration extending along the sides of the silicon substrate 12.

As shown in FIG. 3, the ring-shaped resistance circuit 15 is provided with four electrode pads $15D_1$, $15D_2$, $15D_3$ and $15D_4$ which are formed on the top surface of the multi-layered insulating structure 14, and the electrode pacts $15D_1$, $15D_2$, $15D_3$ and $15D_4$ are symmetrically arranged with respect to the center of the multi-layered insulating structure 14 in the vicinity of the corners of the top surface thereof.

Each of the electrode pads $15D_1$, $15D_2$, $15D_3$ and $15D_4$ is electrically connected to one of the uppermost conductive layers 15C, which is positioned at one end of each of the sides of the top surface of the multi-layered insulating structure 14. In particular, a take-out conductive layer $15E_1$, $15E_2$, $15E_3$ or $15E_4$ is formed on the top surface of the multi-layered insulating structure 14 so as to extend between each of the electrode pads $15D_1$, $15D_2$, $15D_3$ and $15D_4$ and the corresponding uppermost conductive layer 15C, so that the electrical connection is established therebetween.

In short, the respective take-out conductive layers $15E_1$, $15E_2$, $15E_3$ and $15E_4$ are electrically connected to the corresponding uppermost conductive layers 16C at the four locations at which the ring-shaped resistance circuit 15 is sectioned into four sections I, II, III and IV having substantially the same length.

Preferably, as shown in FIG. 3, each of the take-out conductive layers $15E_1$, $15E_2$, $15E_3$ and $15E_4$ includes a first portion perpendicularly and inwardly extending from the corresponding uppermost conductive layer 15C, a second portion extending from the first portion in parallel with the corresponding uppermost conductive layer 15C, and a third portion perpendicularly and inwardly extending from the second portion to the corresponding electrode pad $15D_1$, $15D_2$, $15D_3$ or $15D_4$.

Also, as shown in FIG. 3, the ring-shaped resistance circuit 15 is further provided with four electrode pads $15F_1$, $15F_2$, $15F_3$ and $15F_4$ which are formed on the top surface of the multi-layered insulating structure 14, and the electrode pads $15F_1$, $15F_2$, $15F_3$ and $15F_4$ have a smaller size than that of the electrode pads $15D_1$, $15D_2$, $15D_3$ and $15D_4$, and are arranged beside the respective electrode pads $15D_1$, $15D_2$, $15D_3$ and $15D_4$. Each of the electrode pads $15F_1$, $15F_2$, $15F_3$ and $15F_4$ is electrically connected to the respective the electrode pads $15D_1$, $15D_2$, $15D_3$ and $15D_4$ through the intermediary of take-out conductive layers $15G_1$, $15G_2$, $15G_3$ and $15G_4$ forged on the top surface of the multi-layered insulating structure 14.

When the aforesaid conductive pattern layers (not shown) and the via-structures (not shown) are alternately formed in the aforesaid insulating interlayers in the multi-layered insulating structure 14, it is possible to simultaneously carry out the formation of the ring-shaped resistance circuit 15 in the multi-layered insulating structure 14.

Figure 5:
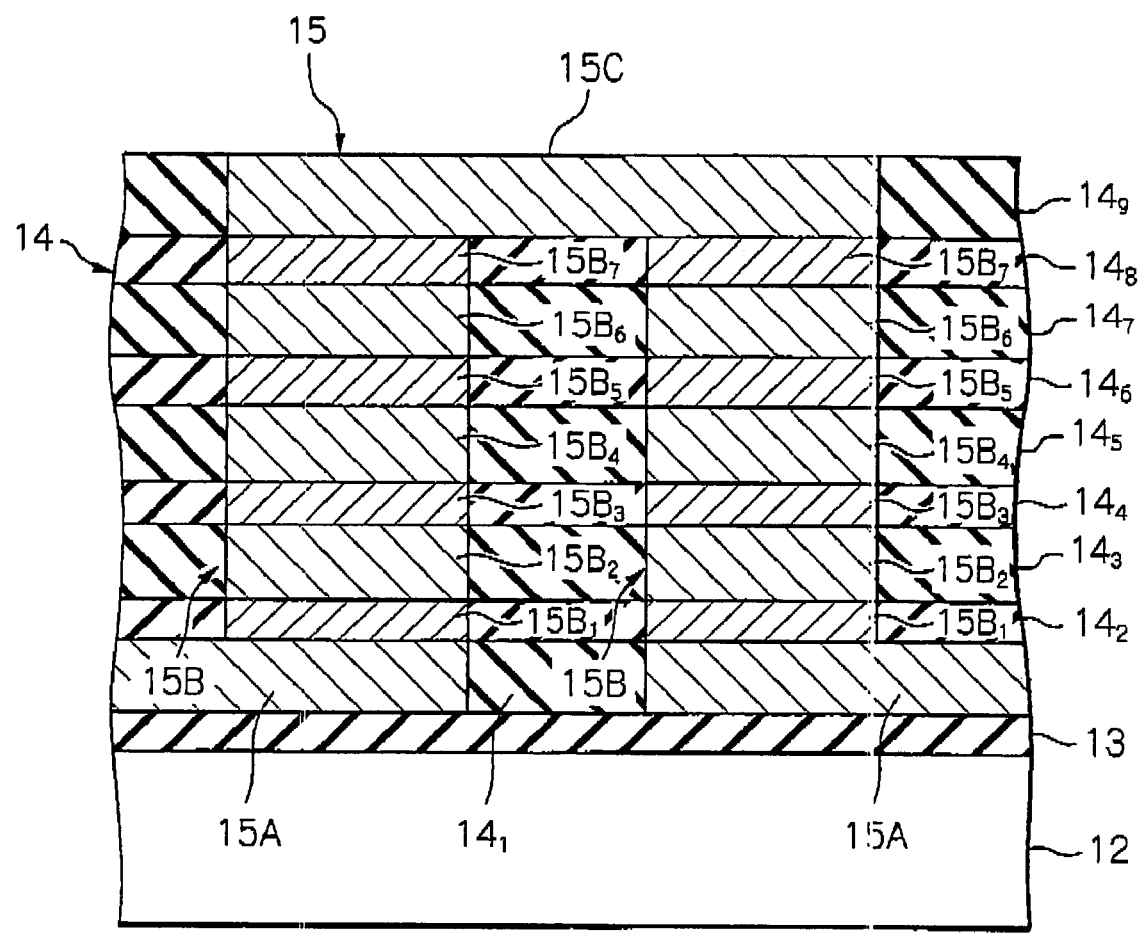
FIG. 5 is a partially-enlarged view of FIG. 4.

In particular, referring to FIG. 5 which is a partially enlarged cross-sectional view of FIG. 4, the insulating interlayers of the multi-layered insulating structure 14 are indicated by references $14_1$ through $14_9$. Note that each of the stacked conductive columns 15B of the ring-shaped resistance circuit 15 includes conductive layers $15B_1$ through $15B_7$ stacked in order.

First, the insulating interlayer $14_1$ is formed on the contact layer 13 by using a CVD process. Then, a conductive pattern layer (not shown) is formed in the insulating interlayer $14_1$ so as to be electrically connected to the contact structures (not shown) formed in the contact layer 13 by using a damascene process. When the formation of the conductive pattern layer (not shown) in the insulating interlayer $14_1$ is carried out, the lowermost conductive layers 15A are simultaneously formed in the insulating interlayer $14_1$.

Next, the insulating interlayer $14_2$ is formed on the insulating interlayer $14_1$ by using a CVD process. Then, a plurality of via-structures (not shown) are formed in the insulating interlayer $14_2$ so as to be electrically connected to the conductive pattern layer (not shown) formed in the insulating interlayer $14_1$ by using a damascene process. When the formation of the via-structures (not shown) in the insulating interlayer $14_2$ is carried out, the conductive layers $15B_1$ are simultaneously formed as via-strictures in the insulating interlayer $14_2$.

Next, the insulating interlayer $14_3$ is formed on the insulating interlayer $14_2$ by using a CVD process. Then, a conductive pattern layer (not shown) is formed in the insulating interlayer $14_3$ so as to be electrically connected to the via-structures (not shown) formed in the insulating interlayer $14_2$ by using a damascene process. When the formation of the conductive pattern layer (not shown) in the insulating interlayer $14_3$ is carried out, the conductive is layers $15B_2$ are simultaneously formed in the insulating interlayer $14_3$.

Next, the insulating interlayer $14_4$ is formed on the insulating interlayer $14_3$ by using a CVD process. Then, a plurality of via-structures (not shown) are formed in the insulating interlayer $14_4$ so as to be electrically connected to the conductive pattern layer (not shown) formed in the insulating interlayer $14_3$ by using a damascene process. When the formation of the via-structures (not shown) in the insulating interlayer $14_4$ is carried out, the conductive layers $15B_3$ are simultaneously formed as via-strictures in the insulating interlayer $14_4$.

Next, the insulating interlayer $14_6$ is formed on the insulating interlayer $14_4$ by using a CVD process. Then, a conductive pattern layer (not shown) is formed in the insulating interlayer $14_5$ so as to be electrically connected to the via-structures (not shown) formed in the insulating interlayer $14_4$ by using a damascene process. When the formation of the conductive pattern layer (not shown) in the insulating interlayer $14_6$ is carried out, the conductive layers $15B_4$ are simultaneously formed in the insulating interlayer $14_5$.

Next, the insulating interlayer $14_6$ is formed on the insulating interlayer $14_5$ by using a CVD process. Then, a plurality of via-structures (not shown) are formed in the insulating interlayer $14_6$ so as to be electrically connected to the conductive pattern layer (not shown) formed in the insulating interlayer $14_5$ by using a damascene process. When the formation of the via-structures (not shown) in the insulating interlayer $14_6$ is carried out, the conductive layers $15B_5$ are simultaneously formed as via-strictures in the insulating interlayer $14_6$.

Next, the insulating interlayer $14_7$ is formed on the insulating interlayer $14_6$ by using a CVD process. Then, a conductive pattern layer (not shown) is formed in the insulating interlayer $14_7$ so as to be electrically connected to the via-structures (not shown) formed in the insulating interlayer $14_6$ fly using a damascene process. When the formation of the conductive-pattern layer (not shown) in the insulating interlayer $14_7$ is carried out, the conductive layers $15B_6$ are simultaneously formed in the insulating interlayer $14_7$.

Next, the insulating interlayer $14_8$ is formed on the insulating interlayer $14_7$ by using a CVD process. Then, a plurality of via-structures (not shown) are formed in the insulating interlayer $14_8$ so as to be electrically connected to the conductive pattern layer (not shown) formed in the insulating interlayer $14_7$ by using a damascene process. When the formation of the via-structures (not shown) in the insulating interlayer $14_8$ is carried out, the conductive layers $15B_7$ are simultaneously formed as via-structures in the insulating interlayer $14_8$, resulting in completion of the formation of the stacked conductive columns 15B.

Then, the insulating interlayer $14_9$ is formed on the insulating interlayer $14_8$ by using a CVD process. Then, a conductive pattern layer (not shown in FIG. 3) is formed in the insulating interlayer $14_7$ so as to be electrically connected to the via-structures (not shown) formed in the insulating interlayer $14_8$ by using a damascene process. When the formation of the conductive pattern layer (not shown in FIG. 3) in the insulating interlayer 14, is carried out, the uppermost conductive layers 15C are simultaneously formed in the insulating interlayer $14_9$ together with the electrode pads $15D_1$, $15D_2$, $15D_3$ and $15D_4$, the conductive layers $15E_1$, $15E_2$, $15E_3$ and $15E_4$, the electrode pads $15F_1$, $15F_2$, $15F_3$ and $15F_4$ and the conductive layers $15G_1$, $15G_2$, $15G_3$ and $15G_4$, resulting in completion of the formation of the ring-shaped resistance circuit 15.

Note that the insulating interlayers $14_1$ through $14_9$ may be formed of a suitable low-k material such as an SiOC layer, an SiC layer, an SiOF layer, a porous $SiO_2$ layer, a porous SiOC layer or the like. Also, note that the conductive pattern layers (not shown), the via-structures (not shown), and the conductive layers 15A, $15B_1$ through $15B_7$ and 15C may be formed of a suitable metal material such as copper (Cu).

In reality, a plurality of semiconductor devices 1 are produced at once in a semiconductor wafer such as a silicon wafer, and the silicon wafer is subjected to a dicing process in which the silicon wafer is cut so that the semiconductor devices 1 are separated from each other.

During the dicing process, the low-k insulating interlayers $14_1$ through $14_9$ are susceptible to a defect such as a crack because they exhibit an inferior physical strength to that of another insulating layer such as a silicone dioxide layer.

On the other hand, while the silicon wafer is subjected to the various processes for the production of the semiconductor devices 1, the conductive layers 15A, $15B_1$ through $15B_7$ and 15C included in the ring-shaped resistance circuit 15 are liable to be peeled from the low-k insulating interlayers $14_1$ through $14_9$ due to the fact that the difference in a thermal expansion coefficient between the low-k insulating inter-layers $14_1$ through $14_9$ and the conductive layers 15A, $15B_1$ through $15B_7$ and 15C is relatively large.

After the dicing process, each of the semiconductor devices 1 is tested to determine whether any defects and/or the peeling have occurred in the ring-shaped resistance circuit 15 by using a test apparatus including four needle-like probes and a voltmeter.

Figure 6A:
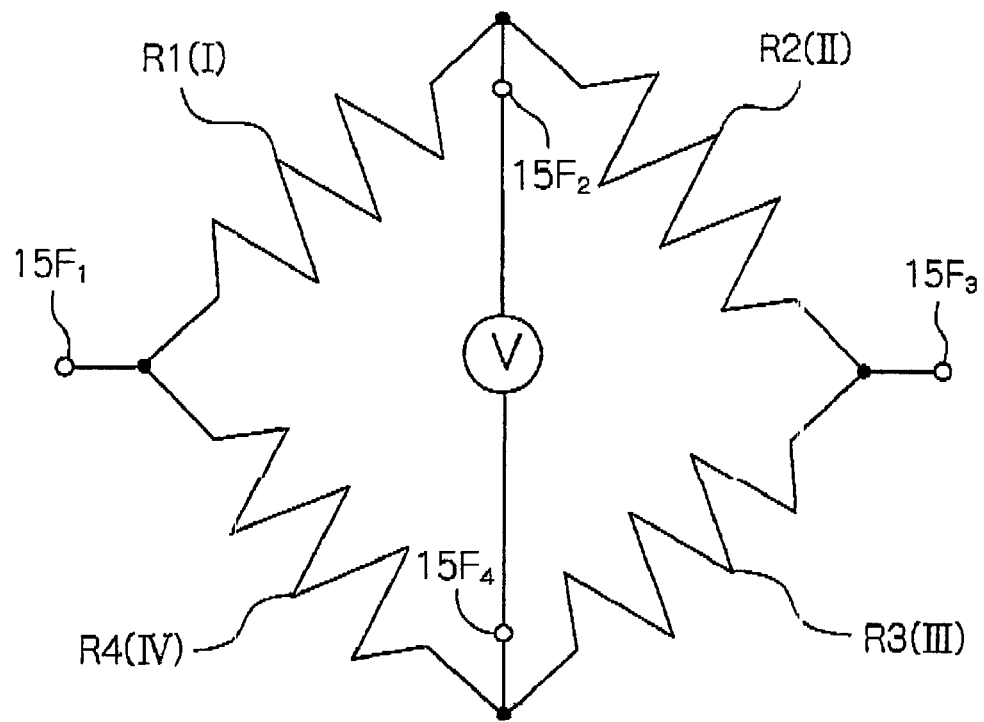
FIG. 6A is a circuit diagram which is defined by a ring-shaped resistance circuit formed in the semiconductor device of FIGS. 3 and 4.

In particular, as shown in FIG. 6A which is a circuit diagram of the ring-shaped resistance circuit 15 of FIG. 3, the needle-like probes of the test apparatus are contacted with the respective electrode pads $15F_1$, $15F_2$, $15F_3$ and $15F_4$ of the ring-shaped resistance circuit 15 (see: FIG. 3) so that a Wheatstone bridge is defined together with the ring-shaped resistance circuit 15. Note that, in FIG. 6A, respective references R1, R2, R3 and R4 indicate resistances of the sections I, II, III and IV of the ring-shaped resistance circuit 15, and reference V indicates the voltmeter of the test apparatus.

When no defect and/or peeling has occurred in the ring-shaped resistance circuit 15, the following equation is formed:

$$R1 \times R3 - R2 \times R4 = 0$$

In this case, it is possible to presume that no defect and/or no peeling may occur in the interior of the multi-layered insulating structure 14.

On the other hand, when a defect and/or a peeling occur in the ring-shaped resistance circuit 15, the following equation is formed;

$$R1 \times R3 - R2 \times R4 \neq 0$$

In this case, it is possible to presume that a defect and/or a peeling may occur in the interior of the multi-layered insulating structure 14.

Figure 6B:
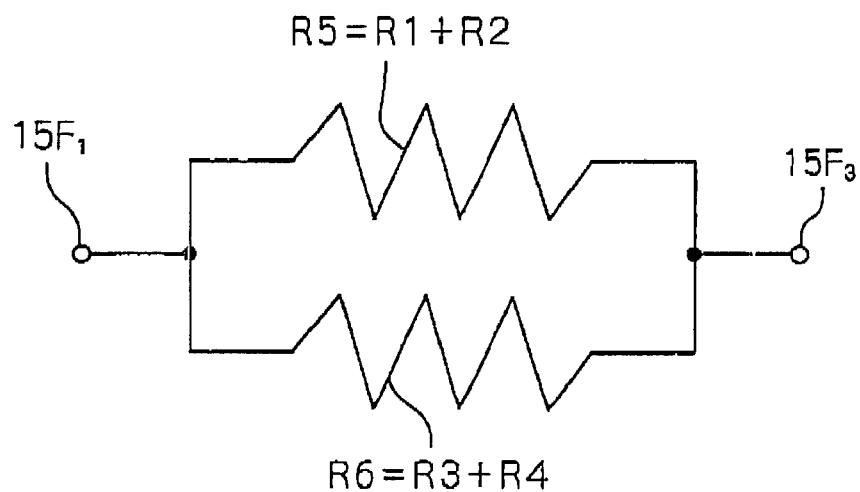
FIG. 6B is another circuit diagram which is defined by the ring-shaped resistance circuit formed in the semiconductor device of FIGS. 3 and 4.

Also, as shown in FIG. 6B which is another circuit diagram of the ring-shaped resistance circuit 15, for example, two of the needle-like probes of the test apparatus are contacted with the respective diagonal electrode pads $15F_1$ and $15F_3$ of the ring-shaped resistance circuit 15 (see: FIG. 3) so that another circuit is defined. Note, a resistance R5 is the sum of the resistances R1 and R2 (see: FIG. 6A), and a resistance R6 is the sum of the resistances R3 and R4 (see: FIG. 6A).

In FIG. 6B, a resistance R0 is measured between the respective diagonal electrode pads $15F_1$ and $15F_3$ by the test apparatus. When no defect and/or peeling has occurred in the ring-shaped resistance circuit 15, the following-equation is formed:

$$R0 = R5 \times R6/(R5|R6) = 1/2 \times R5 \text{ or } 1/2 \times R6 (R5 = R6)$$

In this case, it is possible to presume that no defect and/or no peeling may occur in the interior of the multi-layered insulating structure 14.

On the other hand, when a defect and/or a peeling occurs in the ring-shaped resistance circuit 15, the following equation is formed:

$$R0 = R5 \text{ or } R6$$

In this case, it is possible to presume that a defect and/or a peeling may occur in the interior of the multi-layered insulating structure 14.

Note, in the test of FIG. 6B, of course, the two needle-like probes of the test apparatus may be contacted with the respective diagonal electrode pads $15F_2$ and $15F_4$ of the ring-shaped resistance circuit 15 (see: FIG. 3).

Figure 7:
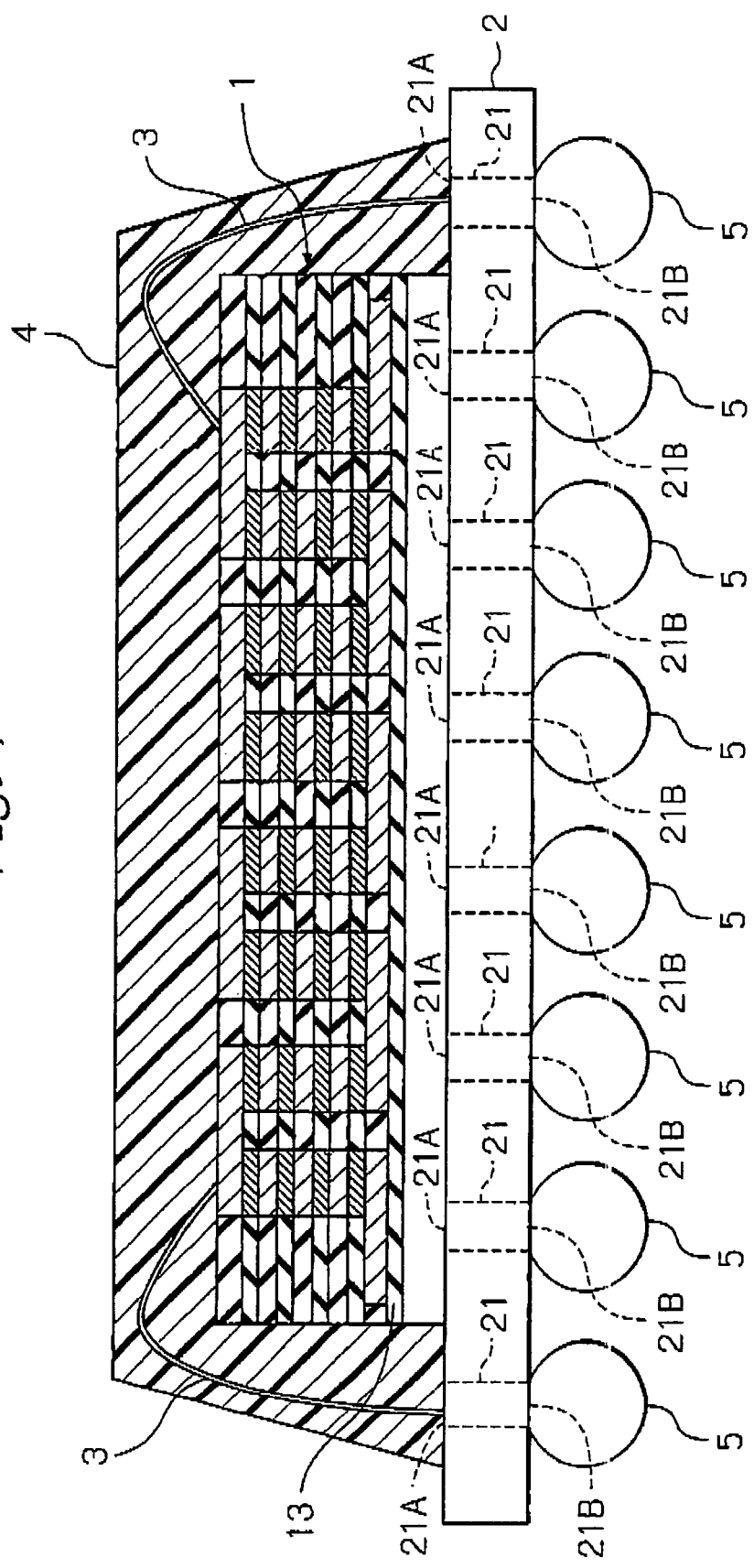
FIG. 7 is a cross-sectional view of the first embodiment of the BGA type semiconductor package using the semiconductor device of FIGS. 3 and 4.

With reference to FIG. 7 which is a partially cross-sectional view of the first embodiment of the semiconductor package according to the present invention, the semiconductor device 1 of FIGS. 2 to 5 is securely mounted on a wiring board 2 which is called an interposer or a package board.

A plurality of through plugs 21 are formed in the wiring board 2. Each of the through plugs 21 has an upper end face 21A exposed on the top surface of the wiring board 2 and serving as an upper electrode pad, and a lower end face 21B exposed on the bottom surface of the wiring board and serving as a lower electrode pad.

After the mounting of the semiconductor device 1 on the wiring board 2 is completed, the electrode pads (not shown in FIG. 3) on the top surface of the semiconductor device 1 are electrically connected to the upper electrode pads 21A on the top surface of the wiring board 2 by a plurality of bonding wires 3, using a wire bonding machine, resulting in establishment of electrical connections between the semiconductor device 1 and the wiring board 2. At this time, each of the electrode pads $15D_1$, $15D_2$, $15D_3$ and $15D_4$ is electrically connected to one of the upper electrode pads 21A by one of the bonding wire 3. Preferably, for example, the electrode pads $15D_1$, $15D_2$, $15D_3$ and $15D_4$ may be connected to the four the upper electrode pads 21A which are arranged at the corners of the wiring board 2.

In the aforesaid test, when each of the needle-like probes of the test apparatus is contacted with one of the electrode pads $15D_1$, $15D_2$, $15D_3$ and $15D_4$, the electrode pad concerned may be scored with the needle-like probe. In this case, a boding wire 3 may not be properly bonded to the scored electrode pad $15D_1$, $15D_2$, $15D_3$ or $15D_4$. Thus, as shown in FIG. 3, it is preferable that the electrode pads $15F_1$, $15F_2$, $15F_3$ and $15F_4$ for testing are provided besides the respective electrode pads $15D_1$, $15D_2$, $15D_3$ and $15D_4$.

Thereafter, a sealing resin layer 4 is formed over the top surface of the wiring board 2 by using a transfer molding process, so that the semiconductor device 1, the bonding wires 3 and so on are sealed and protected by the sealing resin layer 4.

After the formation of the sealing resin layer 4 over the wiring board 2 is completed, a plurality of external electrode terminals 5 such as solder balls are soldered to the respective lower electrode pads 21B on the bottom surface of the wiring board 2, resulting in completion of manufacture of is the semiconductor package as a ball gate array (BGA) type.

While the aforesaid wire-bonding process is carried out by the wire bonding machine, the low-k insulating interlayers $14_1$ through $14_9$ are susceptible to a defect such as cracks.

On the other hand, the low-k insulating interlayers $14_1$ and $14_9$ of the multi-layered insulating structure 14 (see: FIG. 5) tend to absorb moisture, and the absorbed moisture causes corrosion in the conductive layers 15A, $15B_1$ through $15B_7$ and 15C included in the ring-shaped resistance circuit 15.

Before the semiconductor package of FIG. 7 is shipped, the semiconductor device 1, which is encapsulated in the sealing resin layer 4, is again tested by using the above-mentioned test apparatus because the electrode pads $15D_1$, $15D_2$, $15D_3$ and $15D_4$ are electrically connected to the corresponding solder balls 5, whereby it is possible to presume whether a defect and/or peeling has occurred in the multi-layered insulating structure 14.

Note, conventionally, it is impossible to test a semiconductor device in the semiconductor package because test electrode pads on the semiconductor device cannot be accessed, as already stated.

Second Embodiment

With reference to FIG. 8 which is a cross-sectional view of a second embodiment of the semiconductor package according to the present invention, the second embodiment is substantially identical to the first embodiment of FIG. 7 except that an endless seal-ring type resistance circuit 15' is substituted for the ring-shaped resistance circuit 15 having the meandering configuration (see: FIGS. 4, 5 and 6).

The endless seal-ring type resistance circuit 15' includes a plurality of endless ring-shaped conductive layers $15_1$ through $15_9$ formed in the respective insulating interlayers $14_1$ through $14_9$ (see: FIG. 5) of the multi-layered insulating structure 14, with each of conductive layers $15_1$, $15_2$, $15_3$ and $15_4$ being defined as via-structures. The side walls of the multi-layered insulating structure 14 are covered with the endless seal-ring type resistance circuit 15' so that moisture is prevented from being absorbed by the insulating interlayers $14_1$ through $14_9$.

Finally, it will be understood by those skilled in the art that the foregoing description is of preferred embodiments of the package, and that various changes and modifications may be made to the present invention without departing from the spirit and scope thereof.

The invention claimed is:

1. A semiconductor package, comprising:
a wiring board having a first surface and a second surface, said wiring board being provided with a plurality of first electrode pads exposed on the first surface, thereof, and a plurality of second electrode pads exposed on the second surface thereof, said first electrode pads being electrically connected to said second electrode pads, respectively;
a semiconductor device mounted on the first surface of said wiring board, said semiconductor device including an endless ring-shaped resistance circuit formed in an interior of said semiconductor device along a periphery thereof, and a plurality of third electrode pads provided inside said endless ring-shaped resistance circuit and electrically connected to said endless ring-shaped resistance circuit, said third electrode pads being electrically connected to said first electrode pads, respectively; and
a sealing resin layer formed over the first surface of said wiring board so that said semiconductor device and said first electrode pads are sealed and protected by said sealing resin layer,
wherein said semiconductor device further comprises a multi-layered insulating structure, said endless ring-shaped resistance circuit being formed in said multi-layered insulating structure along a periphery thereof, said third electrode pads being formed on a top surface of said multi-layered insulating structure.

2. The semiconductor package as set forth in claim 1, wherein said semiconductor device further includes a plurality of take-out conductive layers to establish the electrical connection between said third electrode pads and said endless ring-shaped resistance circuit.

3. The semiconductor package as set forth in claim 2, wherein each of said take-out conductive layers includes at least a portion extending in parallel with a side of said endless ring-shaped resistance circuit.

4. The semiconductor package as set forth in claim 2, wherein each of said take-out conductive layers includes a first portion perpendicularly and inwardly extending from a side of said endless ring-shaped resistance circuit, a second portion extending from the first portion in parallel with the side of said endless ring-shaped resistance circuit, and a third portion perpendicularly and inwardly extending from the second portion to a corresponding one of said third electrode pads.

5. The semiconductor package as set forth in claim 1, wherein a number of said third electrode pads is four, and wherein said four third electrode pads are electrically connected to said endless ring-like resistance circuit at four locations at which said endless ring-shaped resistance circuit is sectioned into four sections having substantially the same length.

6. The semiconductor package as set forth in claim 1, wherein at least a part of said endless ring-like resistance circuit is formed as a stacked conductive column.

7. The semiconductor package as set forth in claim 6, wherein said stacked conductive column includes via-structures and conductive layers alternately stacked.

8. The semiconductor package as set forth in claim 1, wherein said endless ring-shaped resistance circuit includes a plurality of lowermost conductive layers arranged along the periphery of said semiconductor device, a plurality of stacked conductive columns which are formed on ends of the lowermost conductive layers, and a plurality of uppermost conductive layers, each of which formed on two stacked conductive columns formed on inner ends of two adjacent lowermost conductive layers.

9. The semiconductor package as set forth in claim 1, wherein said endless ring-shaped resistance circuit is defined as an endless seal-ring type resistance circuit including a plurality of endless ring-shaped conductive layers stacked in order.

10. The semiconductor package as set forth in claim 1, wherein said semiconductor device further includes a plurality of fourth electrode pads arranged beside said third electrode pads.

11. The semiconductor package as set forth in claim 10, wherein said fourth electrode pads have a smaller size than that of said third electrode pads.

12. The semiconductor package as set forth in claim 1, wherein said multi-layered insulating structure includes a plurality of insulating interlayers stacked in order, at least one part of said endless ring-shaped resistance circuit being formed in each of said insulating interlayers.

13. The semiconductor package as set forth in claim 12, wherein each of said insulating interlayers is composed of a low-k material.

14. The semiconductor package as set forth in claim 13, wherein said endless ring-shaped resistance circuit is composed of copper.

* * * * *